United States Patent
Kim et al.

(10) Patent No.: US 9,806,105 B2
(45) Date of Patent: Oct. 31, 2017

(54) THIN FILM TRANSISTOR SUBSTRATE, DISPLAY DEVICE INCLUDING A THIN FILM TRANSISTOR SUBSTRATE, AND METHOD OF FORMING A THIN FILM TRANSISTOR SUBSTRATE

(71) Applicant: LG Display Co., Ltd., Seoul (KR)

(72) Inventors: Wonkyung Kim, Busan (KR); Soyoung Noh, Gyeonggi-do (KR); Hyunsoo Shin, Gyeonggi-do (KR); Kyeongju Moon, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/295,128

(22) Filed: Oct. 17, 2016

(65) Prior Publication Data
US 2017/0117304 A1    Apr. 27, 2017

(30) Foreign Application Priority Data

Oct. 27, 2015  (KR) .......................... 10-2015-0149281

(51) Int. Cl.
| | |
|---|---|
| H01L 27/32 | (2006.01) |
| H01L 29/786 | (2006.01) |
| H01L 51/56 | (2006.01) |
| H01L 27/12 | (2006.01) |
| H01L 29/66 | (2006.01) |
| G02F 1/136 | (2006.01) |
| G02F 1/1345 | (2006.01) |

(52) U.S. Cl.
CPC ...... *H01L 27/1251* (2013.01); *H01L 27/1222* (2013.01); *H01L 27/1225* (2013.01); *H01L 27/1259* (2013.01); *H01L 29/66757* (2013.01); *H01L 29/66969* (2013.01); *H01L 29/7869* (2013.01); *H01L 29/78606* (2013.01); *H01L 29/78675* (2013.01)

(58) Field of Classification Search
CPC ........... H01L 29/78606; H01L 27/1225; H01L 27/3244; H01L 29/7869; H01L 51/5253; H01L 51/5259; H01L 2227/323; H01L 27/3262
USPC .................. 257/43, 57, 59; 438/23, 158, 795
See application file for complete search history.

(56) References Cited

U.S. PATENT DOCUMENTS

| | | | |
|---|---|---|---|
| 2015/0055047 A1* | 2/2015 | Chang ................. | H01L 27/3262 349/43 |
| 2015/0206982 A1* | 7/2015 | Moon ............... | H01L 29/78678 257/72 |
| 2016/0300896 A1* | 10/2016 | Park .................... | H01L 27/3248 |

* cited by examiner

*Primary Examiner* — Kimberly Rizkallah
*Assistant Examiner* — Brian Turner
(74) *Attorney, Agent, or Firm* — Morgan, Lewis & Bockius LLP

(57) ABSTRACT

Provided are a thin film transistor (TFT) substrate, a display device, and a method of forming the TFT. A TFT substrate includes: a first TFT including: a polycrystalline semiconductor (PS) layer, a first gate electrode (GE) overlapping the PS layer, a nitride layer (NL) on the first GE, an oxide layer (OL) on the NL, and a first source electrode and a first drain electrode on the OL, and a second TFT including: a second GE on a same layer as the first GE, a hydrogen collecting layer between the second GE and the NL, an oxide semiconductor (OS) layer on the OL, a second source electrode and a second drain electrode contacting respective sides of the OS layer, wherein the first TFT and the second TFT are disposed on a same substrate, and wherein the NL includes an opening exposing the hydrogen collecting layer of the second TFT.

12 Claims, 12 Drawing Sheets

THIN FILM TRANSISTOR SUBSTRATE, DISPLAY DEVICE INCLUDING A THIN FILM TRANSISTOR SUBSTRATE, AND METHOD OF FORMING A THIN FILM TRANSISTOR SUBSTRATE

CROSS-REFERENCE TO RELATED APPLICATION(S)

This application claims the benefit of Korean Patent Application No. 10-2015-0149281, filed on Oct. 27, 2015, the entire disclosure of which is hereby incorporated by reference herein for all purposes.

BACKGROUND

1. Technical Field

The present disclosure relates to a thin film transistor (TFT) substrate, in which different type of thin film transistors are disposed on the same substrate, a display device including a thin film transistor substrate, and a method of forming a thin film transistor substrate.

2. Discussion of the Related Art

With the development of an information society, demands for display devices displaying an image are increasing in various ways. In a field of the display devices, a large-sized cathode ray tube (CRT) has been rapidly replaced by a flat panel display (FPD) having advantages of a thin profile, light weight, and a large-sized screen. Examples of the flat panel display include a liquid crystal display (LCD), a plasma display panel (PDP), an organic light-emitting diode (OLED) display, and an electrophoresis display (EPD).

Each of the LCD, the OLED display, and the EPD, that are driven in an active manner, includes a thin film transistor (TFT) substrate, on which thin film transistors assigned to pixel areas arranged in a matrix are disposed. The LCD displays an image by controlling a light transmittance of liquid crystals using an electric field. The OLED display displays an image by forming an organic light-emitting element in each of pixels arranged in a matrix.

The OLED display includes self-emitting elements capable of emitting light by themselves and has advantages of a fast response time, a high emission efficiency, a high luminance, and a wide viewing angle. The OLED display, using characteristics of OLEDs having good energy efficiency, may be classified into a passive matrix organic light-emitting diode (PMOLED) display and an active matrix organic light-emitting diode (AMOLED) display.

As the development of personal electronic devices has been actively carried out, display devices have been developed as products excellent in portability and/or ability to be worn. For portable and/or wearable display devices, the display devices are required to implement low power consumption. Technologies related to display devices developed so far have a limitation in implementing low power consumption.

SUMMARY

Accordingly, the present disclosure is directed to a thin film transistor substrate, a display device including the thin film transistor substrate, and a method of forming the thin film transistor substrate that substantially obviate one or more of the problems due to limitations and disadvantages of the related art.

An object of the disclosure is to provide a thin film transistor substrate including two or more types of thin film transistors on the same substrate, a display device including the thin film transistor substrate, and a method of forming the thin film transistor substrate. Another object of the present disclosure is to provide a thin film transistor substrate including thin film transistors having improved characteristics by minimizing or preventing hydrogen from flowing into an oxide semiconductor layer.

Additional features and advantages will be set forth in the description which follows, and in part will be apparent from the description, or may be learned by practice of the invention. The objectives and other advantages of the disclosure will be realized and attained by the structure particularly pointed out in the written description and claims thereof as well as the appended drawings.

To achieve these and other advantages and in accordance with the purpose of the present disclosure, as embodied and broadly described, there is provided a thin film transistor substrate, including: a first thin film transistor including: a polycrystalline semiconductor layer, a first gate electrode overlapping the polycrystalline semiconductor layer, a nitride layer on the first gate electrode, an oxide layer on the nitride layer, and a first source electrode and a first drain electrode on the oxide layer, and a second thin film transistor including: a second gate electrode on a same layer as the first gate electrode, a hydrogen collecting layer between the second gate electrode and the nitride layer, an oxide semiconductor layer on the oxide layer, a second source electrode contacting one side of the oxide semiconductor layer, and a second drain electrode contacting the other side of the oxide semiconductor layer, wherein the first thin film transistor and the second thin film transistor are disposed on a same substrate, and wherein the nitride layer includes an opening exposing the hydrogen collecting layer of the second thin film transistor.

In another aspect, there is provided a method of forming a thin film transistor substrate, including: providing a first thin film transistor including: providing a polycrystalline semiconductor layer, providing a first gate electrode overlapping the polycrystalline semiconductor layer, providing a nitride layer on the first gate electrode, providing an oxide layer on the nitride layer, and providing a first source electrode and a first drain electrode on the oxide layer, and providing a second thin film transistor including: providing a second gate electrode on a same layer as the first gate electrode, providing a hydrogen collecting layer between the second gate electrode and the nitride layer, providing an oxide semiconductor layer on the oxide layer, providing a second source electrode contacting one side of the oxide semiconductor layer, and providing a second drain electrode contacting the other side of the oxide semiconductor layer, wherein the first thin film transistor and the second thin film transistor are disposed on a same substrate, and wherein the providing the nitride layer includes forming an opening exposing the hydrogen collecting layer of the second thin film transistor.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the disclosure.

Figure 1:
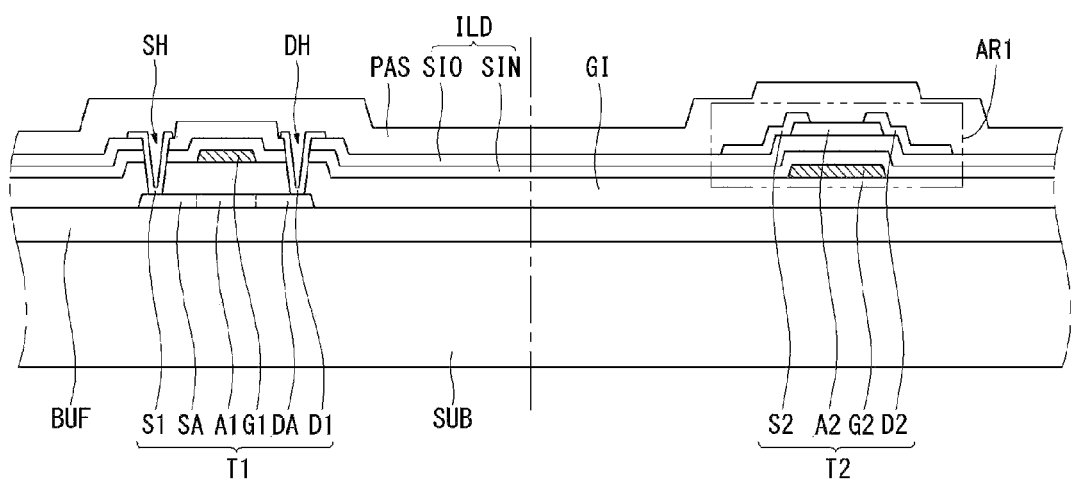
FIG. 1 is a cross-sectional view of a thin film transistor substrate including different types of thin film transistors according to an example embodiment.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned "on or above" or "under or below" another structure, this description should be construed as including a case in which the structures contact each other as well as a case in which a third structure is disposed therebetween.

Hereinafter, example embodiments of the present disclosure will be described in detail with reference to the accompanying drawings.

A thin film transistor (TFT) substrate for a flat panel display according to an example embodiment includes a first thin film transistor in a first area of a substrate and a second thin film transistor in a second area of the substrate. The substrate may include a display area and a non-display area. A plurality of pixel areas may be arranged in a matrix in the display area. In the pixel areas, display elements for performing display operations may be disposed. The non-display area may be disposed around the display area and may have driving elements for driving the display elements of the pixel areas.

The first area may be a portion of the non-display area, and the second area may be a portion of the display area. In one example, the first thin film transistor and the second thin film transistor may be spaced apart from each other, or both the first and second areas may be included in the display area. For example, when a single pixel area includes a plurality of thin film transistors, the first thin film transistor and the second thin film transistor may be disposed adjacent to each other.

A polycrystalline semiconductor material may be used for a gate driver and/or a multiplexer (MUX) driving thin film transistors for the display elements because it has low energy power consumption and excellent reliability owing to its high mobility (e.g., 100 $cm^2/Vs$ or above). Moreover, the polycrystalline semiconductor material may be used for driving a thin film transistor of each pixel in an organic light-emitting diode (OLED) display. An oxide semiconductor material may be suitable for a switching thin film transistor having a short on-time and a long off-time because of its low off-current. Moreover, the oxide semiconductor material may be suitable for a display device requiring a low-speed drive and/or low power consumption by an increase in a voltage hold time of the pixel resulting from a low off-current of the oxide semiconductor material. An optimum thin film transistor substrate can be implemented by disposing two different types of thin film transistors on the same substrate as discussed above.

When a semiconductor layer is made of a polycrystalline semiconductor material, an impurity injection process and a high-temperature thermal process may be performed. On the other hand, when the semiconductor layer is made of an oxide semiconductor material, the processes may be performed at a relatively low temperature. Thus, a polycrystalline semiconductor layer, which undergoes severe formation conditions, may be formed, and then an oxide semiconductor layer may be formed. To this end, the first thin film transistor including the polycrystalline semiconductor material may have a top-gate structure, and the second thin film transistor including the oxide semiconductor material may have a bottom-gate structure.

In a manufacturing process of a display device, because characteristics of the polycrystalline semiconductor material may be degraded if it has vacancies, a process for filling the vacancies with hydrogen by a hydrogenation process may be desirable. On the other hand, because vacancies not covalently bonded in the oxide semiconductor material can serve as carriers, a process for stabilizing the oxide semiconductor material while occupying the vacancies may be desirable. The two processes may be performed through a subsequent thermal process at 350° C. to 380° C.

To perform the hydrogenation process, a nitride layer including a large amount of hydrogen particles may be disposed on the polycrystalline semiconductor material. Because the material used to form the nitride layer contains a large amount of hydrogen, the nitride layer itself may contain a considerable amount of hydrogen. Hydrogen atoms may be diffused into the polycrystalline semiconductor material through thermal processes. As a result, the polycrystalline semiconductor layer may be stabilized. During the thermal process, excessive amounts of hydrogen may not be diffused into the oxide semiconductor material. Thus, an oxide layer may be disposed between the nitride layer and the oxide semiconductor material. After the thermal process is performed, the oxide semiconductor material may maintain a state in which it is not affected too much by hydrogen, thereby achieving device stabilization.

For convenience of explanation, in the following examples, the first thin film transistor is a thin film transistor used as a driving element formed in the non-display area, and the second thin film transistor is a thin film transistor used as a display element disposed in the pixel area of the display area. However, embodiments are not limited thereto. For example, in the OLED display, both the first thin film transistor and the second thin film transistor may be disposed in the pixel area of the display area. In one example, a first thin film transistor including a polycrystalline semiconductor material may be applicable to a driving thin film transistor, and a second thin film transistor including an oxide semiconductor material may be applicable to a switching thin film transistor.

<First Embodiment>

FIG. 1 is a cross-sectional view of a thin film transistor substrate including different types of thin film transistors according to an example embodiment. With reference to FIG. 1, a first example embodiment is described. In the following description, embodiments are described mainly using a cross-sectional view capable of clearly illustrating characteristics, and a figure related to a plan structure is not illustrated for convenience of explanation.

In the FIG. 1 example, a thin film transistor substrate for a flat panel display according to a first example embodiment may include a first thin film transistor T1 and a second thin film transistor T2 on a substrate SUB. The first and second thin film transistors T1 and T2 may be spaced apart from each other, may be disposed adjacent to each other, or may overlap each other.

A buffer layer BUF may be stacked on the entire surface of the substrate SUB. The buffer layer BUF may be omitted in some embodiments. In some embodiments, the buffer layer BUF may have a stacked structure of a plurality of thin film layers or a single layer. For convenience of explanation, the buffer layer BUF is illustrated as a single layer in the example embodiment. A light shielding layer may be optionally provided only in a desired portion between the buffer layer BUF and the substrate SUB. The light shielding layer may prevent external light from coming into a semiconductor layer of a thin film transistor disposed on the light shielding layer.

A first semiconductor layer A1 may be disposed on the buffer layer BUF. The first semiconductor layer A1 may include a channel region of the first thin film transistor T1. The channel region may be defined as an overlap portion of a first gate electrode G1 and the first semiconductor layer A1. As the first gate electrode G1 may overlap a center portion of the first thin film transistor T1, the center portion of the first thin film transistor T1 may become the channel region. Both sides of the channel region may be regions doped with impurities, which may be defined as a source region SA and a drain region DA.

When the first thin film transistor T1 is a thin film transistor for a driving element, the first thin film transistor T1 may have characteristics suitable to perform high-speed driving. For example, the first thin film transistor T1 may be implemented as a p-type metal-oxide-semiconductor (PMOS) thin film transistor or an n-type MOS (NMOS) thin film transistor, or a complementary MOS (CMOS) thin film transistor including both the PMOS thin film transistor and the NMOS thin film transistor. The PMOS thin film transistor, the NMOS thin film transistor, and/or the CMOS thin film transistor may include a polycrystalline semiconductor material, such as polycrystalline silicon. The first thin film transistor T1 may have a top-gate structure. Embodiments are not limited to these examples.

A gate insulating layer GI may be stacked on the entire surface of the substrate SUB, on which the first semiconductor layer A1 is disposed. The gate insulating layer GI may be made of, e.g., silicon nitride ($SiN_x$) or silicon oxide ($SiO_x$). The gate insulating layer GI may have a thickness of, e.g., about 1,000 Å to 1,500 Å in consideration of stability and characteristics of the element. The gate insulating layer GI made of silicon nitride ($SiN_x$) may contain a large amount of hydrogen due to its manufacturing process. Hydrogen atoms may diffuse out of the gate insulating layer GI in a subsequent process. Thus, the gate insulating layer GI may be made of a silicon oxide ($SiO_x$) material.

The hydrogen diffusion may have a positive effect on the first semiconductor layer A1 including a polycrystalline silicon material. However, the hydrogen diffusion may have a negative effect on the second thin film transistor T2 that has different properties from the first thin film transistor T1. Thus, when the thin film transistors including different materials are formed on the same substrate as in the embodiment, silicon oxide ($SiO_x$) not affecting the element may be used. In another embodiment, the gate insulating layer GI may be made thick, e.g., about 2,000 Å to 4,000 Å, unlike that described in the first example embodiment. If the gate insulating layer GI is made of silicon nitride ($SiN_x$), too much hydrogen may be diffused. Therefore, taking multiple factors into consideration, the gate insulating layer GI may be made of silicon oxide ($SiO_x$).

The first gate electrode G1 and a second gate electrode G2 may be disposed on the gate insulating layer GI. The first gate electrode G1 may overlap the center portion of the first semiconductor layer A1. The second gate electrode G2 may be disposed in a portion of the second thin film transistor T2. In an example in which the first gate electrode G1 and the second gate electrode G2 are made of the same material on the same layer using the same mask, the manufacturing process can be simplified.

An interlayer dielectric layer ILD may be stacked to cover the first and second gate electrodes G1 and G2. For example, FIG. 1 illustrates that the interlayer dielectric layer ILD may have a multilayered structure, in which a nitride layer SIN including silicon nitride ($SiN_x$) and an oxide layer SIO including silicon oxide ($SiO_x$) are alternately stacked. For convenience of explanation, the illustrated examples of the interlayer dielectric layer ILD may have a simplified illustration, e.g., a two-layered structure in which an oxide layer SIO is stacked on a nitride layer SIN.

The nitride layer SIN may be provided to hydrogenate the first semiconductor layer A1 including polycrystalline silicon by diffusing the hydrogen included in the nitride layer SIN through a subsequent thermal process. On the other hand, the oxide layer SIO may be provided to prevent too much hydrogen, released from the nitride layer SIN due to the subsequent thermal process, from being diffused into the semiconductor material of the second thin film transistor T2.

For example, hydrogen released from the nitride layer SIN may diffuse into the first semiconductor layer A1, which may be disposed lower in the stack than the oxide layer SIO, with the gate insulating layer GI interposed between them. Accordingly, the nitride layer SIN may be disposed on the gate insulating layer GI, close to the first semiconductor layer A1. On the other hand, too much hydrogen released from the nitride layer SIN can be prevented from being diffused into the semiconductor material of the second thin film transistor T2 disposed on the nitride layer SIN. Thus, the oxide layer SIO may be formed on the nitride layer SIN.

When considering the manufacturing process, a total thickness of the interlayer dielectric layer ILD may be, e.g., about 2,000 Å to 6,000 Å. The nitride layer SIN and the oxide layer SIO each may have a thickness of, e.g., about 1,000 Å to 3,000 Å. Also, for the hydrogen in the nitride layer SIN to exert as little effect as possible on a second semiconductor layer A2 while diffusing in abundance into the first semiconductor layer A1, the thickness of the oxide layer SIO may be greater than the thickness of the gate insulating layer GI. For example, because the oxide layer SIO may be used to adjust a degree of diffusion of hydrogen released from the nitride layer SIN, the oxide layer SIO may be made thicker than the nitride layer SIN.

The second semiconductor layer A2 overlapping the second gate electrode G2 may be disposed on the oxide layer SIO of the interlayer dielectric layer ILD. The semiconductor layer A2 may include a channel region of the second thin film transistor T2. When the second thin film transistor T2 is a thin film transistor for a display element, the second thin film transistor T2 may have characteristics suitable to perform a display operation. For example, the second thin film transistor T2 may include an oxide semiconductor material, such as indium gallium zinc oxide (IGZO), indium gallium oxide (IGO), and/or indium zinc oxide (IZO). The oxide semiconductor material may be suitable for display devices requiring a low-speed drive and/or low power consumption by an increase in a voltage hold time of the pixel resulting from a low off-current characteristic of the oxide semiconductor material. When the second thin film transistor T2 includes the oxide semiconductor material, the second thin film transistor T2 may have a bottom-gate structure capable of more efficiently securing the stability of the element when considering the structure, in which one substrate includes different types of thin film transistors as in the illustrated example embodiment.

Source and drain electrodes may be disposed on the semiconductor layer A2 and the interlayer dielectric layer ILD. A first source electrode S1 and a first drain electrode D1 may be spaced apart from each other at a predetermined distance while facing each other, with the first gate electrode G1 interposed in the middle between them. The first source electrode S1 may be connected to the source region SA, which corresponds to one side of the first semiconductor layer A1 exposed through a source contact hole SH. The source contact hole SH may penetrate the interlayer dielectric layer ILD and the gate insulating layer GI, and may expose the source region SA corresponding to the one side of the first semiconductor layer A1. The first drain electrode D1 may be connected to the drain region DA, which corresponds to the other side of the first semiconductor layer A1 exposed through a drain contact hole DH. The drain contact hole DH may penetrate the interlayer dielectric layer ILD and the gate insulating layer GI, and may expose the drain region DA corresponding to the other side of the first semiconductor layer A1.

A second source electrode S2 and a second drain electrode D2 may directly contact upper surfaces of one side and the other side of the second semiconductor layer A2, respectively, and may be spaced apart from each other by a predetermined distance. The second source electrode S2 may directly contact an upper surface of the interlayer dielectric layer ILD and the upper surface of one side of the semiconductor layer A2. The second drain electrode D2 may directly contact an upper surface of the interlayer dielectric layer ILD and the upper surface of the other side of the second semiconductor layer A2.

The first thin film transistor T1 and the second thin film transistor T2 may be covered with a passivation layer PAS. Afterwards, the passivation layer PAS may be patterned to form more contact holes exposing the first drain electrode D1 and/or the second drain electrode D2. Moreover, a pixel electrode, that contacts the first drain electrode D1 and/or the second drain electrode D2 through the contact holes, may be formed on the passivation layer PAS. Here, only the parts related to the structure of the thin film transistors showing the characteristics of the embodiment that are described in detail are illustrated and explained for convenience.

As described above, the thin film transistor substrate for a flat panel display according to an example embodiment may have a structure in which the first thin film transistor T1 including a polycrystalline semiconductor material and the second thin film transistor T2 including an oxide semiconductor material are formed on the same substrate SUB. For example, the first gate electrode G1, including the first thin film transistor T1, and the second gate electrode G2, including the second thin film transistor T2, may be formed on the same layer using the same material, although embodiments are not limited thereto.

The first semiconductor layer A1 including the polycrystalline semiconductor material of the first thin film transistor T1 may be disposed under the first gate electrode G1, and the second semiconductor layer A2 including the oxide semiconductor material of the second thin film transistor T2 may be disposed on the second gate electrode G2. Thus, an embodiment may have a structure that can prevent the oxide semiconductor material from being exposed at a high temperature during the manufacturing process by forming the first semiconductor layer A1 at a relatively high temperature, then forming the second semiconductor layer A2 at a relatively low temperature. Accordingly, the first thin film transistor T1 may have a top-gate structure because the first semiconductor layer A1 may be formed earlier than the first gate electrode G1. The second thin film transistor T2 may have a bottom-gate structure because the second semiconductor layer A2 may be formed later than the second gate electrode G2.

A hydrogenation process of the first semiconductor layer A1 including the polycrystalline semiconductor material may be performed simultaneously with a thermal process of the second semiconductor layer A2 including the oxide semiconductor material. To this end, the interlayer dielectric layer ILD may have a structure in which the oxide layer SIO is stacked on the nitride layer SIN. Because of characteristic of the manufacturing process, the hydrogenation process may diffuse the hydrogen contained in the nitride layer SIN into the first semiconductor layer A1 through the thermal process. Moreover, the thermal process may stabilize the second semiconductor layer A2 including the oxide semiconductor material. The hydrogenation process may be performed after stacking the interlayer dielectric layer ILD on the first semiconductor layer A1, and the thermal process may be formed after forming the second semiconductor layer A2. According to the first embodiment, the oxide layer SIO stacked on the nitride layer SIN and under the second semiconductor layer A2 may prevent too much hydrogen contained in the nitride layer SIN from being diffused into the second semiconductor layer A2 including the oxide semiconductor material. Thus, the hydrogenation process may be performed simultaneously with the thermal process for stabilizing the oxide semiconductor material.

As described above, the first embodiment can reduce or prevent hydrogen from the nitride layer SIN from flowing into the second semiconductor layer A2 by properly adjusting thicknesses of the nitride layer SIN and the oxide layer SIO. However, considering the characteristics of the second thin film transistor T2, the first embodiment has a limitation in preventing hydrogen from flowing into the second semiconductor layer A2 by adjusting only a thickness of the interlayer dielectric layer ILD.

Figure 2:
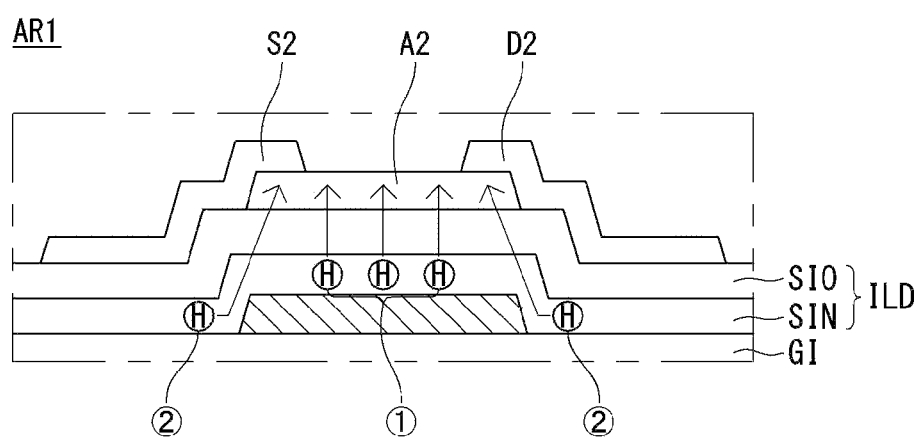
FIG. 2 is an enlarged view of an area AR1 shown in FIG. 1.

FIG. 2 is an enlarged view of an area AR1 shown in FIG. 1. Hereinafter, an alternative and a problem for reducing the diffusion of hydrogen into the second semiconductor layer are described with reference to FIG. 2.

Hydrogen (illustrated as "H" in a circle) may flow along a shortest path ① from a portion of the nitride layer SIN overlapping the second semiconductor layer A2 to the second semiconductor layer A2. Further, hydrogen may flow along an indirect path (or detour path) ② from a portion of the nitride layer SIN not overlapping the second semiconductor layer A2 to the second semiconductor layer A2. In FIG. 2, "①" indicates a shortest path of hydrogen flowing into the second semiconductor layer A2, and "②" indicates an indirect path of hydrogen flowing into the second semiconductor layer A2.

As an alternative for blocking the hydrogen flow paths ① and ②, a structure of the interlayer dielectric layer ILD interposed between the second gate electrode G2 and the second semiconductor layer A2 may change. For example, a thickness of the oxide layer SIO on the nitride layer SIN may increase, or an additional protective layer (not shown) may be stacked on the oxide layer SIO or interposed between the nitride layer SIN and the oxide layer SIO.

However, an increase in the thickness of the oxide layer SIO or the additional protective layer may lead to an increase in a total thickness of the interlayer dielectric layer ILD. As the thickness of the interlayer dielectric layer ILD increases, a distance between the second gate electrode G2 and the second semiconductor layer A2 may increase. Hence, even if a voltage is applied to the second gate electrode G2, an electric field may not be generated in the second semiconductor layer A2, or an on-current of the second thin film transistor T2 may decrease. In other words, the increase in the thickness of the oxide layer SIO or the additional protective layer may have a trade-off between blocking the hydrogen flow paths of the second semiconductor layer A2 and a degradation in the characteristics of the second thin film transistor T2. Thus, a new structure may block the hydrogen flow paths of the second semiconductor layer A2 without an increase in the total thickness of the interlayer dielectric layer ILD.

<Second Embodiment>

Figure 3:
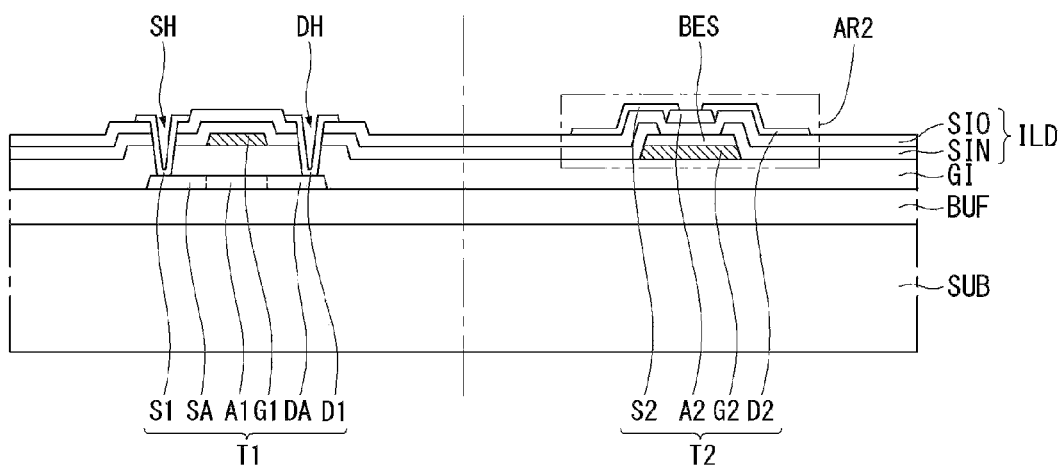
FIG. 3 is a cross-sectional view of a thin film transistor substrate including different types of thin film transistors according to an example embodiment.
Figure 4:
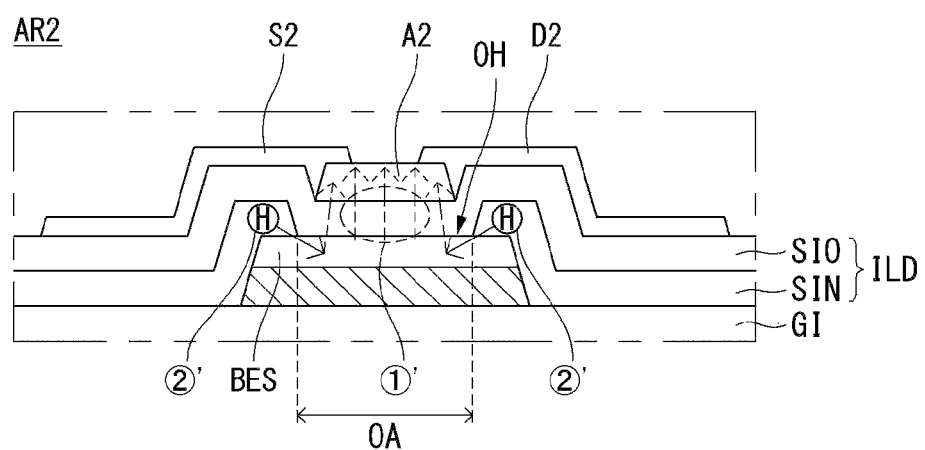
FIG. 4 is an enlarged view of an area AR2 shown in FIG. 3.

FIG. 3 is a cross-sectional view of a thin film transistor substrate including different types of thin film transistors according to an example embodiment. FIG. 4 is an enlarged view of an area AR2 shown in FIG. 3. With reference to FIGS. 3 and 4, a thin film transistor substrate according to a second example embodiment is described.

In the examples of FIGS. 3 and 4, a thin film transistor substrate according to a second example embodiment may include a first thin film transistor T1 in a first area and a second thin film transistor T2 in a second area. The first thin film transistor T1 may include a first semiconductor layer A1, a first gate electrode G1, a first source electrode S1, and a first drain electrode D1. The first semiconductor layer A1 may include a polycrystalline semiconductor material. The first semiconductor layer A1 may be disposed on a substrate SUB and may be used to define a source region SA, a channel region, and a drain region DA. The first gate electrode G1 may overlap the channel region with a gate insulating layer GI interposed between them. The first source electrode S1 may be disposed on a nitride layer SIN and an oxide layer SIO, which may be sequentially stacked on the first gate electrode G1. The first source electrode S1 may contact the source region SA through a source contact hole SH penetrating the oxide layer SIO, the nitride layer SIN, and the gate insulating layer GI. The first drain electrode D1 may be disposed on the nitride layer SIN and the oxide layer SIO, and may contact the drain region DA through a drain contact hole DH penetrating the oxide layer SIO, the nitride layer SIN, and the gate insulating layer GI. The first source electrode S1 and the first drain electrode D1 may be spaced apart from each other.

The second thin film transistor T2 may include a second gate electrode G2, a hydrogen collecting layer BES, a second semiconductor layer A2, a second source electrode S2, and a second drain electrode D2. The second gate electrode G2 may be disposed on the gate insulating layer GI. The hydrogen collecting layer BES may be disposed on the second gate electrode G2 while overlapping the second gate electrode G2. The second semiconductor layer A2 may include an oxide semiconductor material. The second semiconductor layer A2 may be disposed on the oxide layer SIO and the nitride layer SIN having an opening OH exposing the hydrogen collecting layer BES. The second semiconductor layer A2 may overlap the second gate electrode G2. The second source electrode S2 may contact one side of the second semiconductor layer A2, and the second drain electrode D2 may contact the other side of the second semiconductor layer A2. The second source electrode S2 and the second drain electrode D2 may be spaced apart from each other.

The second embodiment may selectively remove a portion of the nitride layer SIN overlapping the second semiconductor layer A2. For example, an open area OA may be defined in the thin film transistor substrate according to the second embodiment. The open area OA may be formed from selectively removing a portion of the nitride layer SIN at a portion where it would overlap the second semiconductor layer A2, such that the open area OA is under the entire width of the second semiconductor layer A2. The open area OA may correspond to area having a shortest path ① (see FIG. 2) where hydrogen flows from a nitride layer SIN according to the first embodiment into the second semiconductor layer A2. The second embodiment can block a shortest path ①' of hydrogen flowing into the second semiconductor layer A2 by selectively removing the nitride layer SIN in the open area OA. The shortest path ①' indicates a path along which hydrogen may flow from a portion of the nitride layer SIN overlapping the second semiconductor layer A2 into the second semiconductor layer A2. In the open area OA, the second semiconductor layer A2 may overlap the hydrogen collecting layer BES with only the oxide layer SIO interposed between them.

The second thin film transistor T2 according to the second embodiment may include the hydrogen collecting layer BES on the second gate electrode G2. The nitride layer SIN may cover the hydrogen collecting layer BES, and may have the opening OH exposing most of an upper surface of the hydrogen collecting layer BES. The upper surface of the hydrogen collecting layer BES exposed through the opening OH may correspond to the open area OA. The hydrogen collecting layer BES may function to collect hydrogen, which may flow from a remaining portion (or an unremoved portion) of the nitride layer SIN outside the open area OA into the second semiconductor layer A2, along an indirect path ②'. The indirect path ②' indicates a path along which hydrogen may flow from a portion of the nitride layer SIN not overlapping the second semiconductor layer A2 into the second semiconductor layer A2.

Hence, the second embodiment can prevent the degradation in the characteristics of the second thin film transistor T2 generated when hydrogen flows into the second semiconductor layer A2. For example, the second embodiment can prevent a channel region of the second semiconductor layer A2 from serving as a conductor because hydrogen flowing into the second semiconductor layer A2 may serve as a shallow donor. Further, the second embodiment can provide the thin film transistor substrate including the thin film transistors having the improved characteristics by minimizing or preventing hydrogen from flowing from the nitride layer SIN into the second semiconductor layer A2.

FIGS. 5A to 5H are cross-sectional views illustrating a method of manufacturing the thin film transistor substrate according to the second embodiment. Hereinafter, a method of manufacturing the thin film transistor substrate according to the second embodiment is described in detail with reference to FIGS. 5A to 5H. The characteristics of the thin film transistor substrate according to the second embodiment are described in more detail through the manufacturing method.

Figure 5A:
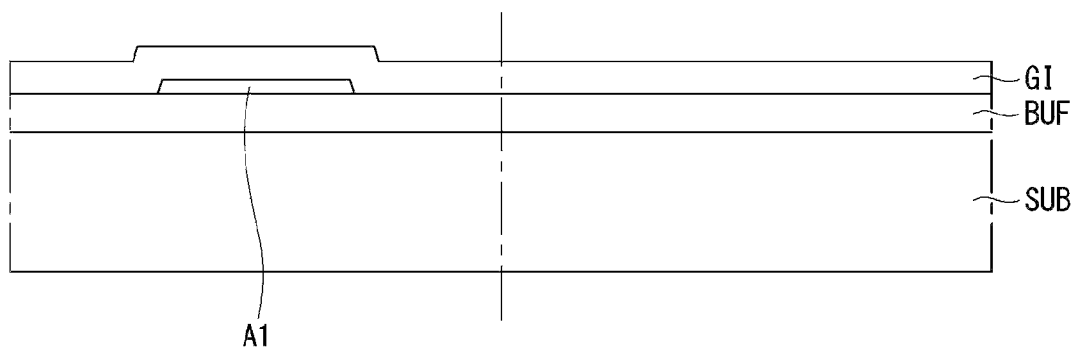
FIGS. 5A to 5H are cross-sectional views illustrating a method of manufacturing a thin film transistor substrate according to an example embodiment.

With references to the FIG. 5A example, an insulating material may be applied to the substrate SUB to form the buffer layer BUF. Although not shown, a light shielding layer may optionally be formed on the substrate SUB. The light shielding layer may overlap a channel region of a semiconductor layer of a thin film transistor, that will be formed in a subsequent process.

An amorphous silicon (a-Si) material may be deposited on the buffer layer BUF, and may be crystallized to form a polycrystalline semiconductor material. The polycrystalline semiconductor material may be patterned to form the first semiconductor layer A1. An insulating material may be deposited on the entire surface of the substrate SUB, on which the first semiconductor layer A1 is formed, to form the gate insulating layer GI. The gate insulating layer GI may be made, e.g., of silicon oxide ($SiO_x$). The gate insulating layer GI may have a thickness of, e.g., about 1,000 Å to 1,500 Å.

Figure 5B:
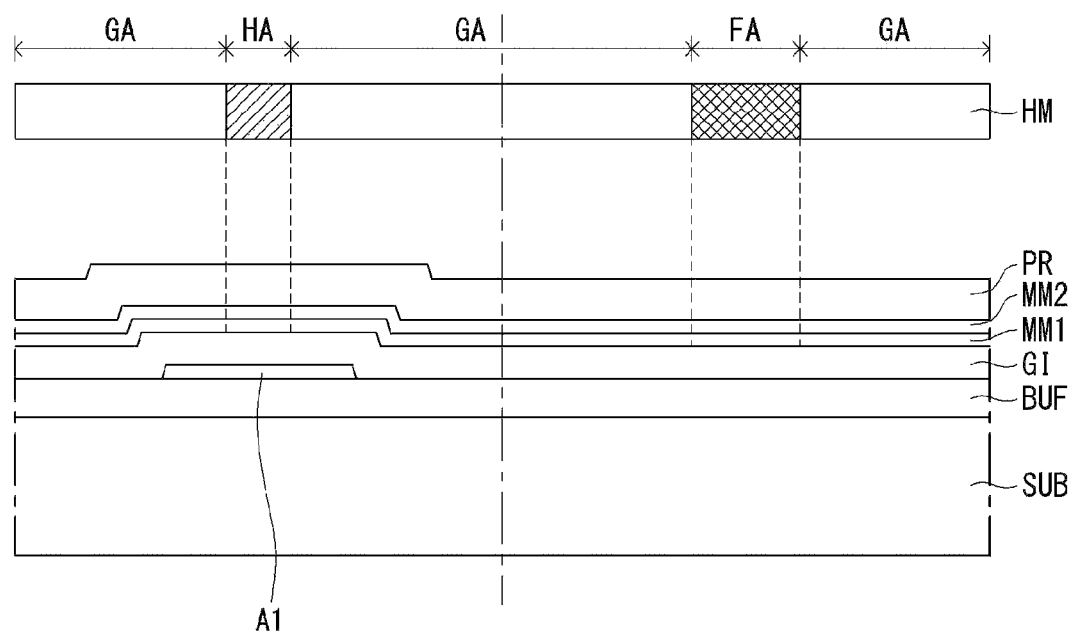

With reference to the FIG. 5B example, a first metal material MM1 and a second metal material MM2 may be sequentially deposited on the entire surface of the substrate SUB, on which the gate insulating layer GI may be formed. The first metal material MM1 may include a material, such as copper (Cu), molybdenum (Mo), aluminum (Al), chrome (Cr), gold (Au), titanium (Ti), nickel (Ni), neodymium (Nd), tantalum (Ta), tungsten (W), or an alloy thereof. The second metal material MM2 may include a material, such as indium gallium zinc oxide (IGZO), indium tin oxide (ITO), indium zinc oxide (IZO), and/or indium tin zinc oxide (ITZO).

The second metal material MM2 may use a material that makes a large difference in an etch rate between the first metal material MM1 and the second metal material MM2. For example, the material may be selected so that, when an etching process for patterning the second metal material MM2 is performed, the first metal material MM1 is not damaged. In one example, an etchant may use an oxalic acid-based material. When the etching process is performed using an oxalic acid-based etchant, the second metal material MM2 made of, e.g., IGZO, may be patterned without a damage of the first metal material MM1 made of, e.g., copper (Cu).

A halftone mask HM may be prepared to pattern the first metal material MM1 and the second metal material MM2. The halftone mask HM may include a full tone area FA in which all of irradiated light is blocked, a halftone area HA in which a portion of irradiated light is transmitted and a portion of irradiated light is blocked, and an area GA in which all of irradiated light is transmitted. A photosensitive layer PR made of a photosensitive material, e.g., a photoresist, may be formed on the entire surface of the substrate SUB, on which the first metal material MM1 and the second metal material MM2 may be deposited, and then light may be selectively irradiated onto the photosensitive layer PR via the halftone mask HM. The photosensitive layer PR may be of a negative type or a positive type. In the following description, an embodiment is described using the photosensitive layer PR of the positive type by way of example.

Figure 5C:
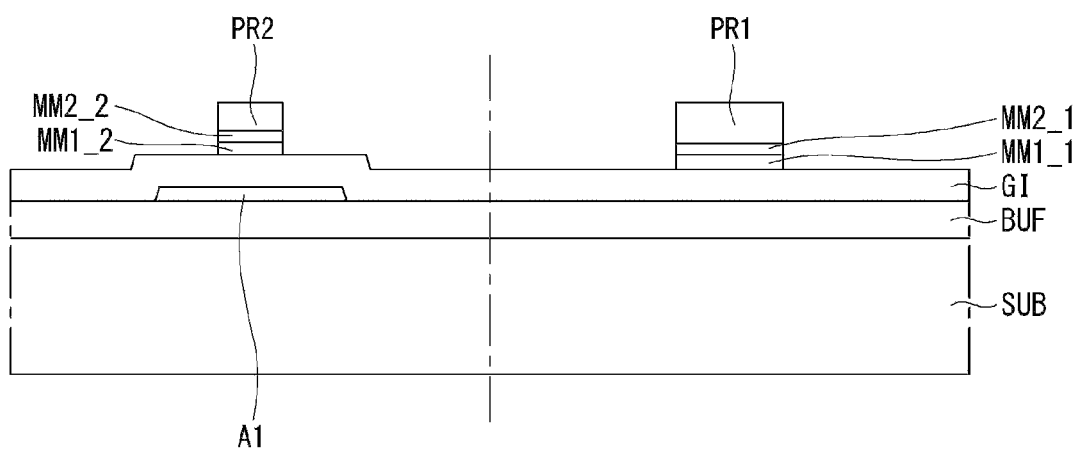

With reference to the FIG. 5C example, when the photosensitive layer PR exposed through the halftone mask HM is developed, the photosensitive layer PR in the area GA, in which all of irradiated light is transmitted, may be removed, and a photosensitive layer PR1 in the full tone area FA and a photosensitive layer PR2 in the halftone area HA may remain. The photosensitive layer PR1 may be over a first metal material MM1_1 and a second metal material MM2_1 remaining in the full tone area FA. The photosensitive layer PR2 may be over a first metal material MM1_2 and a second metal material MM2_2 remaining in the halftone area HA. In one example, the photosensitive layer PR1 of the full tone area FA may be formed thicker than the photosensitive layer PR2 of the halftone area HA. The first metal material MM1 and the second metal material MM2 may be patterned together through a mask process using the remaining photosensitive layers PR1 and PR2.

Figure 5D:
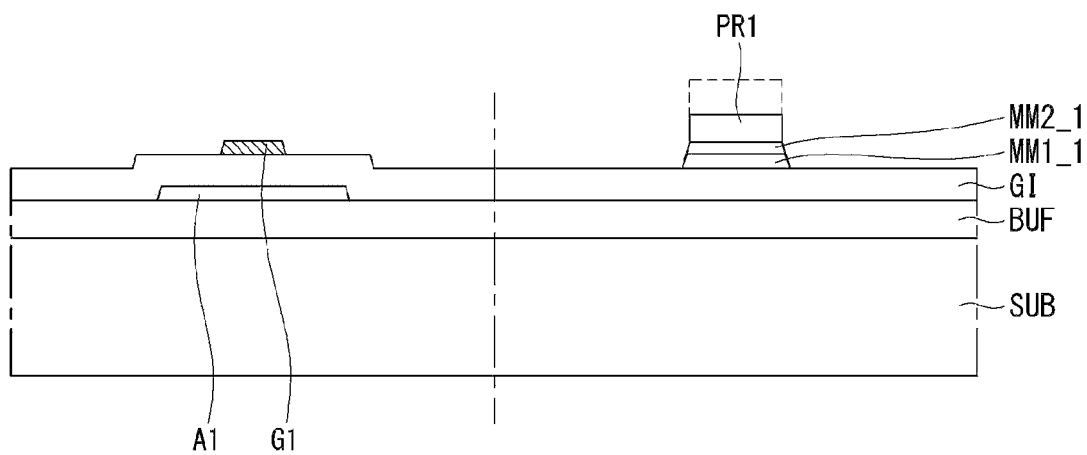

With reference to the FIG. 5D example, an ashing process for partially removing the photosensitive layers PR1 and PR2 may be performed, and only the photosensitive layer PR1 of the full tone area FA may remain. The second metal material MM2_2 remaining in the halftone area HA may be removed through a mask process using the remaining photosensitive layer PR1. The first metal material MM1_2 remaining in the halftone area HA may be formed as the first gate electrode G1. The first gate electrode G1 may overlap a center portion of the first semiconductor layer A1.

Figure 5E:
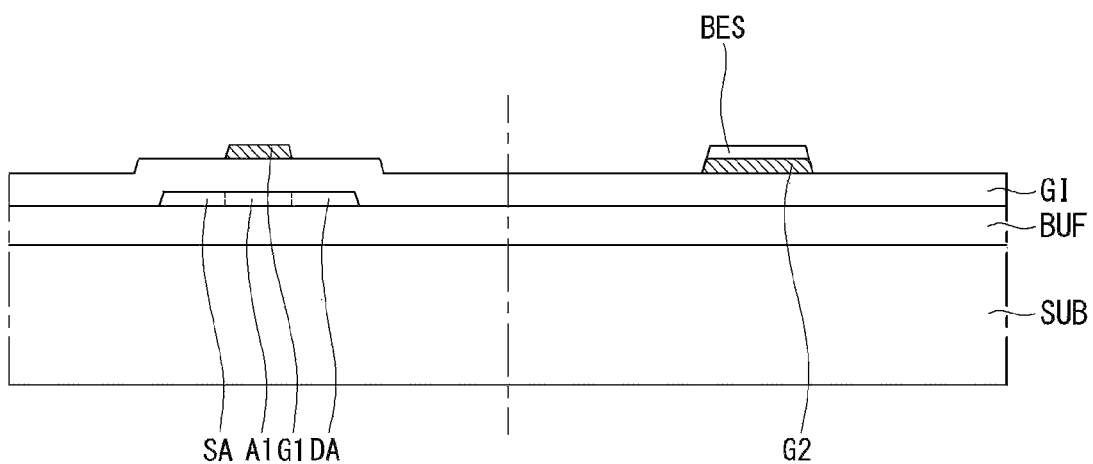

With reference to the FIG. 5E example, the remaining photosensitive layer PR1 may be removed. The first metal material MM1_1 remaining in the full tone area FA may be formed as the second gate electrode G2, and the second metal material MM2_1 remaining in the full tone area FA may be formed as the hydrogen collecting layer BES.

Impurities may be injected into the first semiconductor layer A1 underlying the first gate electrode G1 using the first gate electrode G1 as a mask. A doped region including the source region SA and the drain region DA may be defined by the injection of impurities. A process for defining the doped region may slightly vary, depending on whether the structure is a PMOS thin film transistor, an NMOS thin film transistor, and/or a CMOS thin film transistor. For example, in the NMOS thin film transistor, a heavily doped region may be formed, and then a lightly doped region may be formed. The heavily doped region may be defined using a photoresist pattern of the first gate electrode G1, that is larger than the first gate electrode G1 in size. The lightly doped region may be defined between the heavily doped region and the first gate electrode G1 by removing the photoresist pattern and using the first gate electrode G1 as a mask. The impurity doped regions are not shown in the drawings for convenience of explanation.

Figure 5F:
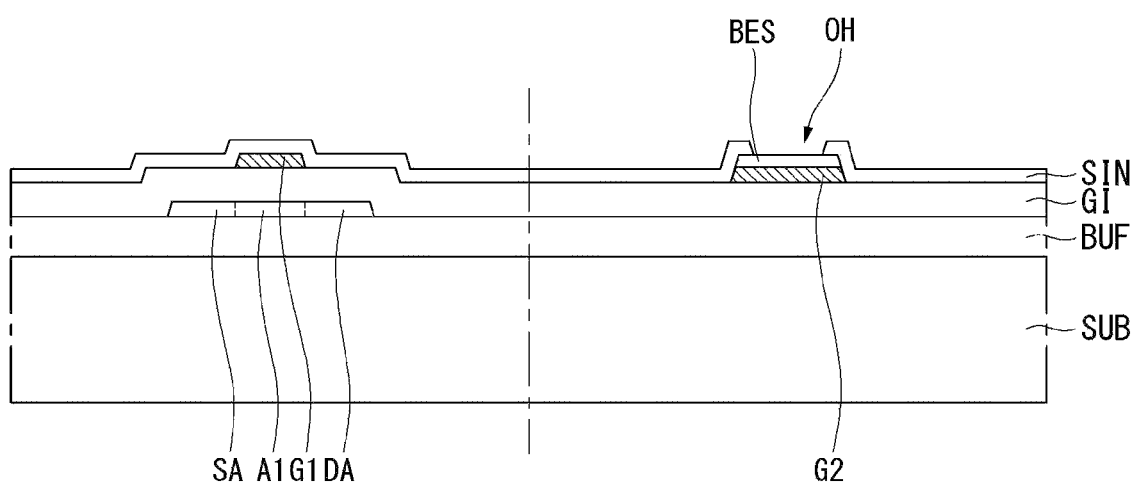

With reference to the FIG. 5F example, the nitride layer SIN may be formed on the entire surface of the substrate SUB, on which the first gate electrode G1, the second gate electrode G2, and the hydrogen collecting layer BES may be formed. The nitride layer SIN may contain a large amount of hydrogen therein during the manufacturing process. The nitride layer SIN may be patterned to form the opening OH exposing most of an upper surface of the hydrogen collecting layer BES. The opening OH may be formed to minimize or prevent hydrogen included in the nitride layer SIN from flowing into a second semiconductor layer A2 (see the FIG. 5G example described below), that will be formed in a subsequent process. For example, a shortest path ①′ (see FIG. 4) along which hydrogen would flow from the nitride layer SIN into the second semiconductor layer A2 can be blocked by selectively removing a portion of the nitride layer SIN overlapping the second semiconductor layer A2. Hence, the second embodiment can minimize or prevent hydrogen from flowing from the nitride layer SIN into the second semiconductor layer A2.

An etching process for forming the opening OH may be performed. The hydrogen collecting layer BES may serve as an etch stopper for protecting the second gate electrode G2 when the opening OH is formed. For example, the second embodiment can prevent damage to the second gate electrode G2, which may be caused by an etchant when the etching process for forming the opening OH is performed, by forming the hydrogen collecting layer BES on the second gate electrode G2. Hence, the second embodiment can secure an interface characteristic of the second gate electrode G2, and can provide the thin film transistor substrate having improved product reliability.

Figure 5G:
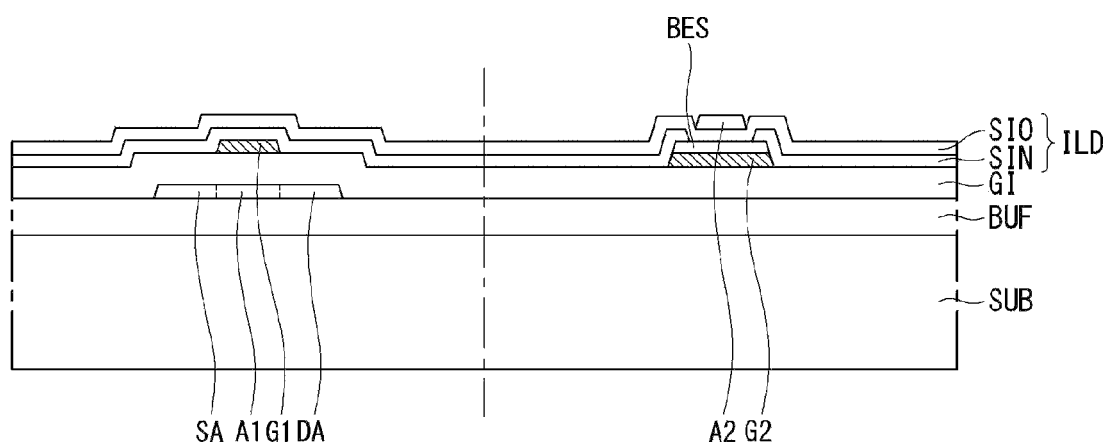

With reference to the FIG. 5G example, the oxide layer SIO may be formed on the entire surface of the substrate SUB, on which the nitride layer SIN may be formed. The interlayer dielectric layer ILD may include the nitride layer SIN and the oxide layer SIO. A thickness of each of the nitride layer SIN and the oxide layer SIO may be properly selected in consideration of a diffusion degree of hydrogen or device characteristics. For example, the nitride layer SIN may be thinner than the oxide layer SIO to prevent an excessive diffusion of hydrogen. In a formation area of the opening OH, the oxide layer SIO may directly contact the hydrogen collecting layer BES.

An oxide semiconductor material may be deposited on the oxide layer SIO. The oxide semiconductor material may include at least one of, e.g., indium gallium zinc oxide (IGZO), indium gallium oxide (IGO), and/or indium zinc oxide (IZO). The oxide semiconductor material may be patterned to form the second semiconductor layer A2. The second semiconductor layer A2 may overlap the second gate electrode G2.

The second semiconductor layer A2 may be disposed with the oxide layer SIO interposed between them, so that it does not directly contact the nitride layer SIN containing a large amount of hydrogen. Further, the second embodiment may form the opening OH by selectively removing a portion of the nitride layer SIN overlapping the second semiconductor layer A2. The second semiconductor layer A2 may overlap the opening OH with only the oxide layer SIO interposed between them.

Figure 5H:
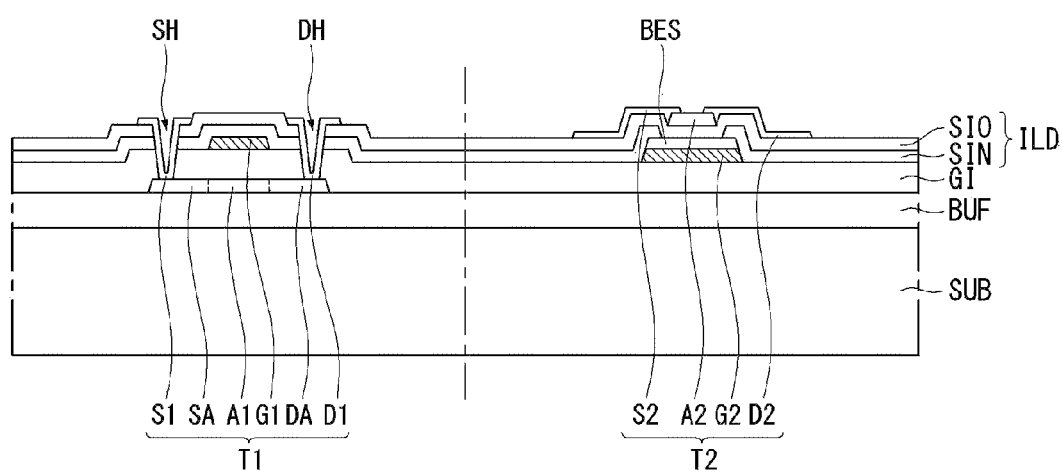

With reference to the FIG. 5H example, the interlayer dielectric layer ILD and the gate insulating layer GI may be patterned to form the source contact hole SH exposing a portion of the source region SA and the drain contact hole DH exposing a portion of the drain region DA. A metal material may be deposited on the interlayer dielectric layer ILD on which the source contact hole SH and the drain contact hole DH may be formed, and may be patterned to form the first and second source electrodes S1 and S2 and the first and second drain electrodes D1 and D2. The first source electrode S1 may contact the source region SA through the source contact hole SH, and the first drain electrode D1 may contact the drain region DA through the drain contact hole DH. The second source electrode S2 may contact one side of the second semiconductor layer A2, and the second drain electrode D2 may contact the other side of the second semiconductor layer A2. Hence, the different types of first and second thin film transistors T1 and T2 disposed on the same substrate SUB may be completed.

The thin film transistor substrate according to embodiments may form two different types of thin film transistors on the same substrate and can make up for disadvantages of one of the two thin film transistors using the other thin film transistor. Embodiments can provide the thin film transistor substrate including the thin film transistors having improved characteristics by minimizing or preventing hydrogen from flowing from the nitride layer into the second semiconductor layer.

It will be apparent to those skilled in the art that various modifications and variations may be made in the present disclosure without departing from the spirit or scope of the invention. Thus, it is intended that embodiments of the present disclosure cover the modifications and variations of this invention provided they come within the scope of the appended claims and their equivalents.

What is claimed is:

1. A thin film transistor substrate, comprising:
   a first thin film transistor comprising:
      a polycrystalline semiconductor layer;
      a first gate electrode overlapping the polycrystalline semiconductor layer;
      a nitride layer on the first gate electrode;
      an oxide layer on the nitride layer; and
      a first source electrode and a first drain electrode on the oxide layer; and
   a second thin film transistor comprising:
      a second gate electrode on a same layer as the first gate electrode;
      a hydrogen collecting layer between the second gate electrode and the nitride layer;
      an oxide semiconductor layer on the oxide layer;
      a second source electrode contacting one side of the oxide semiconductor layer; and
      a second drain electrode contacting the other side of the oxide semiconductor layer,
   wherein the first thin film transistor and the second thin film transistor are disposed on a same substrate,
   wherein the nitride layer comprises an opening exposing the hydrogen collecting layer of the second thin film transistor, and
   wherein the opening of the nitride layer overlaps the oxide semiconductor layer in a vertical direction.

2. The thin film transistor substrate of claim 1, wherein the oxide semiconductor layer overlaps the hydrogen collecting layer with only the oxide layer interposed between them.

3. The thin film transistor substrate of claim 1, wherein the hydrogen collecting layer comprises a material comprising at least one of: indium gallium zinc oxide (IGZO), indium tin oxide (ITO), indium zinc oxide (IZO), and indium tin zinc oxide (ITZO).

4. The thin film transistor substrate of claim 1, wherein the hydrogen collecting layer includes a material having a difference in an etch rate between a material of the second gate electrode and the material of the hydrogen collecting layer.

5. A flat panel display device, comprising:
a display comprising the thin film transistor substrate of claim 1.

6. The flat panel display device of claim 5, wherein the display comprises one of: a liquid crystal display (LCD) device, a plasma display panel (PDP), an organic light-emitting diode (OLED) display device, and a electrophoresis display (ED) device.

7. The thin film transistor substrate of claim 1, wherein the hydrogen collecting layer:
is on the second gate electrode; and
overlaps the second gate electrode in the vertical direction.

8. The thin film transistor substrate of claim 1, wherein the opening of the nitride layer is on the second gate electrode, with the hydrogen collecting layer interposed therebetween.

9. A method of forming a thin film transistor substrate, the method comprising:
providing a first thin film transistor comprising:
providing a polycrystalline semiconductor layer;
providing a first gate electrode overlapping the polycrystalline semiconductor layer;
providing a nitride layer on the first gate electrode;
providing an oxide layer on the nitride layer; and
providing a first source electrode and a first drain electrode on the oxide layer; and
providing a second thin film transistor comprising:
providing a second gate electrode on a same layer as the first gate electrode;
providing a hydrogen collecting layer between the second gate electrode and the nitride layer;
providing an oxide semiconductor layer on the oxide layer;
providing a second source electrode contacting one side of the oxide semiconductor layer; and
providing a second drain electrode contacting the other side of the oxide semiconductor layer,
wherein the first thin film transistor and the second thin film transistor are disposed on a same substrate,
wherein the providing the nitride layer comprises forming an opening exposing the hydrogen collecting layer of the second thin film transistor, and
wherein the opening of the nitride layer overlaps the oxide semiconductor layer in a vertical direction.

10. The method of claim 9, wherein the oxide semiconductor layer overlaps the hydrogen collecting layer with only the oxide layer interposed between them.

11. The method of claim 9, wherein the hydrogen collecting layer comprises a material comprising at least one of: indium gallium zinc oxide (IGZO), indium tin oxide (ITO), indium zinc oxide (IZO), and indium tin zinc oxide (ITZO).

12. The method of claim 9, wherein the providing the hydrogen collecting layer includes providing a material having a difference in an etch rate between a material of the second gate electrode and the material of the hydrogen collecting layer.

* * * * *